(12) United States Patent
Chan et al.

(10) Patent No.: US 8,481,422 B2
(45) Date of Patent: Jul. 9, 2013

(54) PREVENTION AND REDUCTION OF SOLVENT AND SOLUTION PENETRATION INTO POROUS DIELECTRICS USING A THIN BARRIER LAYER

(75) Inventors: Kelvin Chan, San Jose, CA (US); Khaled A. Elsheref, San Jose, CA (US); Alexandros T. Demos, Fremont, CA (US); Mei-Yee Shek, Palo Alto, CA (US); Lipan Li, San Mateo, CA (US); Li-Qun Xia, Cupertino, CA (US); Kang Sub Yim, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/455,299

(22) Filed: Apr. 25, 2012

(65) Prior Publication Data

US 2012/0208366 A1 Aug. 16, 2012

Related U.S. Application Data

(63) Continuation of application No. 12/147,986, filed on Jun. 27, 2008, now Pat. No. 8,236,684.

(51) Int. Cl.
*H01L 21/4763* (2006.01)
(52) U.S. Cl.
USPC .................. 438/622; 438/675; 257/E21.476
(58) Field of Classification Search
USPC ......... 438/622, 627–630, 637–640, 642–644, 438/675
See application file for complete search history.

(56) References Cited

U.S. PATENT DOCUMENTS

| | | |
|---|---|---|
| 6,905,958 B2 | 6/2005 | Gracias et al. |
| 7,015,150 B2 | 3/2006 | Cooney, III et al. |
| 7,015,581 B2 | 3/2006 | Casey et al. |
| 7,057,287 B2 | 6/2006 | Kumar et al. |
| 7,071,091 B2 | 7/2006 | Clarke et al. |
| 7,122,481 B2 | 10/2006 | Kloster et al. |
| 7,135,402 B2 | 11/2006 | Lin et al. |
| 7,144,803 B2 | 12/2006 | Engbrecht et al. |
| 7,199,048 B2 | 4/2007 | Chu et al. |
| 7,217,648 B2 | 5/2007 | Lu et al. |
| 7,226,856 B1 | 6/2007 | Lopatin et al. |
| 7,253,524 B2 | 8/2007 | Wu et al. |
| 7,294,453 B2 | 11/2007 | Gallagher et al. |
| 7,309,658 B2 | 12/2007 | Lazovsky et al. |
| 7,329,956 B1 | 2/2008 | Yu et al. |
| 7,335,586 B2 | 2/2008 | RamachandraRao et al. |

(Continued)

OTHER PUBLICATIONS

International Search Report and Written Opinion of the International Searching Authority mailed Jan. 18, 2010 in PCT/US2009/046610 (APPM/012998PCT).

(Continued)

*Primary Examiner* — Thanh Nguyen
(74) *Attorney, Agent, or Firm* — Patterson & Sheridan, LLP

(57) ABSTRACT

A method and apparatus for treating a substrate is provided. A porous dielectric layer is formed on the substrate. In some embodiments, the dielectric may be capped by a dense dielectric layer. The dielectric layers are patterned, and a dense dielectric layer deposited conformally over the substrate. The dense conformal dielectric layer seals the pores of the porous dielectric layer against contact with species that may infiltrate the pores. The portion of the dense conformal pore-sealing dielectric layer covering the field region and bottom portions of the pattern openings is removed by directional selective etch.

16 Claims, 2 Drawing Sheets

U.S. PATENT DOCUMENTS

| | | | |
|---|---|---|---|
| 7,338,893 B2 | 3/2008 | Engbrecht et al. | |
| 7,338,895 B2 | 3/2008 | Kumar et al. | |
| 2003/0077897 A1* | 4/2003 | Tsai et al. | 438/633 |
| 2004/0227247 A1 | 11/2004 | Chooi et al. | |
| 2005/0020058 A1 | 1/2005 | Gracias et al. | |
| 2005/0020074 A1 | 1/2005 | Kloster et al. | |
| 2005/0020093 A1* | 1/2005 | Ahn et al. | 438/782 |
| 2005/0040532 A1 | 2/2005 | Kumar et al. | |
| 2005/0148209 A1 | 7/2005 | Chu et al. | |
| 2005/0184397 A1 | 8/2005 | Gates et al. | |
| 2005/0200025 A1 | 9/2005 | Casey et al. | |
| 2005/0287826 A1 | 12/2005 | Abell et al. | |
| 2006/0022348 A1 | 2/2006 | Abell et al. | |
| 2006/0108320 A1 | 5/2006 | Lazovsky et al. | |
| 2006/0118961 A1 | 6/2006 | Kumar et al. | |
| 2006/0134906 A1 | 6/2006 | Lu et al. | |
| 2006/0172531 A1 | 8/2006 | Lin et al. | |
| 2006/0172552 A1 | 8/2006 | Ajmera et al. | |
| 2006/0192286 A1* | 8/2006 | Kanamura | 257/758 |
| 2006/0281329 A1 | 12/2006 | RamachandraRao et al. | |
| 2007/0042609 A1 | 2/2007 | Senkevich et al. | |
| 2007/0066079 A1 | 3/2007 | Kloster et al. | |
| 2007/0072412 A1 | 3/2007 | Dunn et al. | |
| 2007/0117371 A1* | 5/2007 | Engbrecht et al. | 438/622 |
| 2007/0173073 A1 | 7/2007 | Weber | |
| 2007/0190777 A1* | 8/2007 | Jiang et al. | 438/633 |
| 2007/0202676 A1 | 8/2007 | Yeh et al. | |
| 2007/0252282 A1* | 11/2007 | Anderson et al. | 257/774 |
| 2007/0278682 A1 | 12/2007 | Ko et al. | |
| 2007/0284746 A1 | 12/2007 | Lopatin et al. | |
| 2007/0287301 A1 | 12/2007 | Xu et al. | |
| 2008/0032064 A1 | 2/2008 | Gordon et al. | |
| 2008/0042283 A1* | 2/2008 | Purushothaman et al. | 257/754 |
| 2008/0099923 A1 | 5/2008 | Kumar et al. | |
| 2008/0108153 A1 | 5/2008 | Miyajima | |
| 2008/0113178 A1 | 5/2008 | Lazovsky et al. | |
| 2010/0151675 A1 | 6/2010 | Tada et al. | |

OTHER PUBLICATIONS

Schulz, Stefan E., et al.; Interface between porous ultra low-k materails for 45nm node and diffusion barrier-pore sealing approaches; In: Center for Microtechnologies, Annual Report 2004, pp. 49-50.

\* cited by examiner

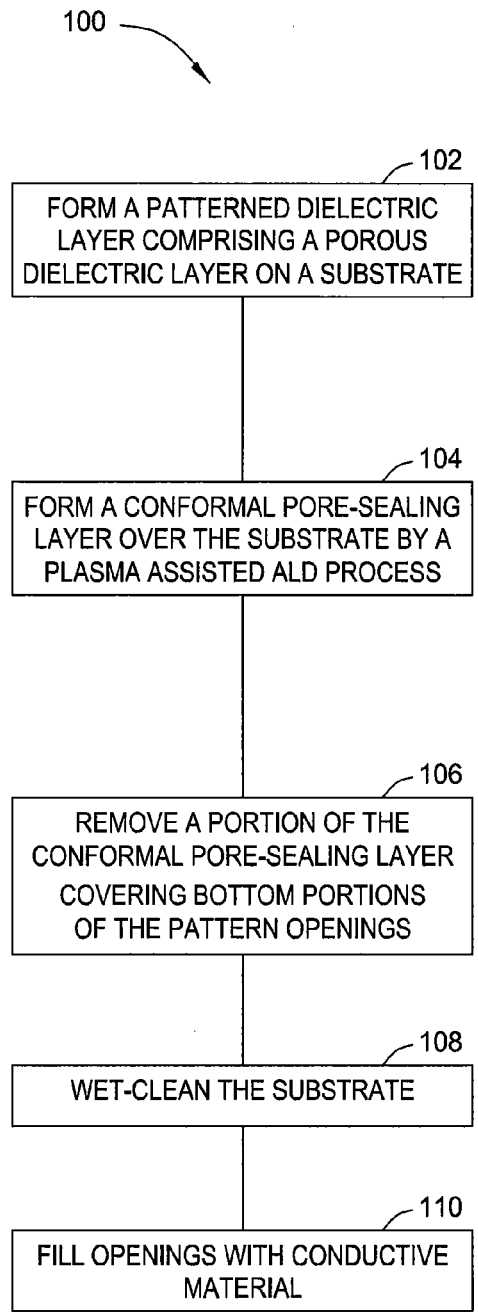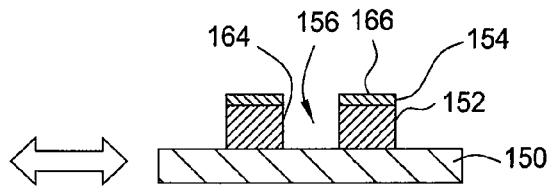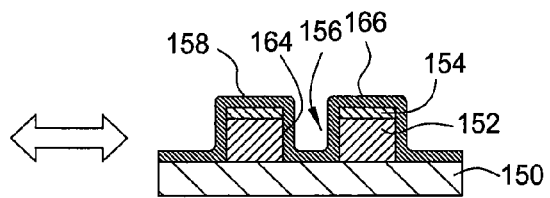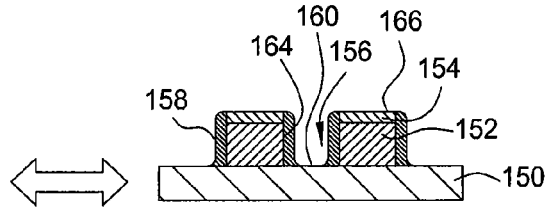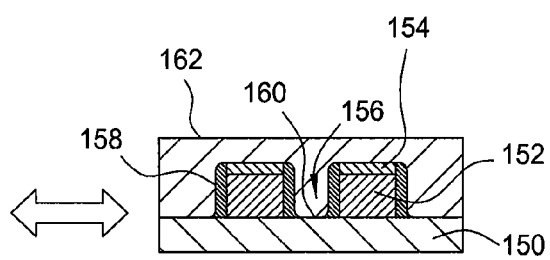
FIG. 1A
FIG. 1B
FIG. 1C
FIG. 1D
FIG. 1E

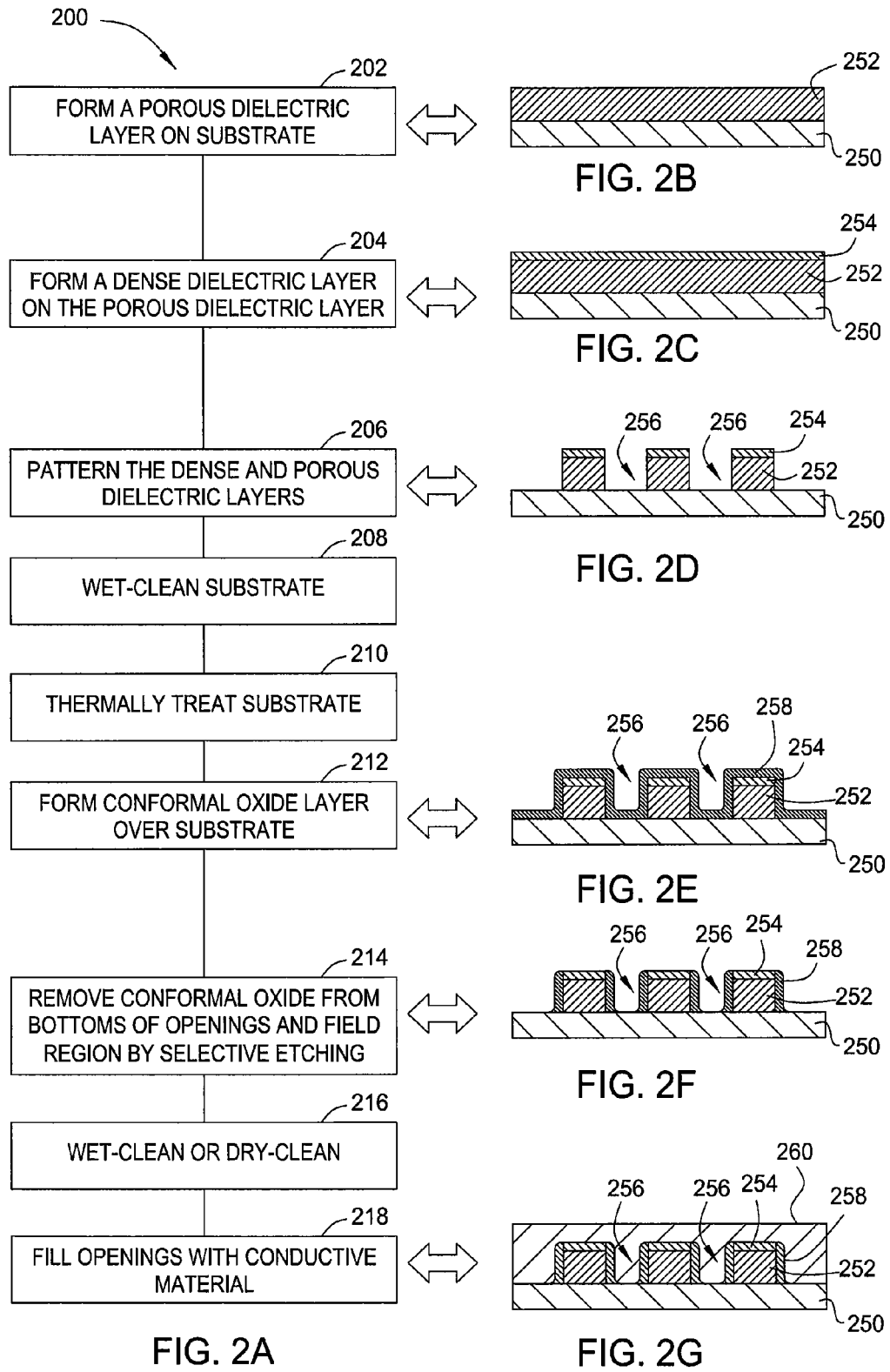

PREVENTION AND REDUCTION OF SOLVENT AND SOLUTION PENETRATION INTO POROUS DIELECTRICS USING A THIN BARRIER LAYER

CROSS-REFERENCE TO RELATED APPLICATIONS

This application is a continuation of co-pending U.S. patent application Ser. No. 12/147,986, filed Jun. 27, 2008, published Dec. 31, 2009, as United States Patent Publication 2009/0325381, and incorporated herein by reference.

BACKGROUND OF THE INVENTION

1. Field of the Invention

Embodiments of the invention relate to fabrication of integrated circuits. More particularly, embodiments of the present invention relate to a process for forming features in a semiconductor substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

The continued reduction in device geometries has generated a demand for inter layer dielectric films having lower dielectric constant (k) values because the capacitive coupling between adjacent metal lines must be reduced to further reduce the size of devices on integrated circuits. In particular, insulators having low dielectric constants, less than about 4.0, are desirable.

More recently, low dielectric constant organosilicon films having dielectric constants less than about 3.0 have been developed. Extreme low k (ELK) organosilicon films having dielectric constants less than 2.5 have also been developed. One method that has been used to develop low dielectric and extreme low dielectric constant organosilicon films has been to deposit the films from a gas mixture comprising an organosilicon compound and a compound, such as a hydrocarbon, comprising thermally labile species or volatile groups and then post-treat the deposited films to remove the thermally labile species or volatile groups, such as organic groups, from the deposited films. The removal of the thermally labile species or volatile groups from the deposited films creates nanometer-sized voids or pores in the films, which lowers the dielectric constant of the films, as air has a dielectric constant of approximately 1.

Rom Ashing processes to remove photoresists or bottom anti-reflective coatings (BARC) can deplete carbon from the low k films and oxidize the surface of the films. The oxidized surface of the low k films is removed during subsequent wet etch processes and contributes to undercuts and critical dimension (CD) loss.

The porosity of the low dielectric constant films can also result in the penetration of precursors used in the deposition of subsequent layers on the films, such as BARC layers or intermetallic barrier layers (TaN, etc.). The diffusion of barrier layer precursors into the porous low dielectric constant films results in current leakage in a device.

Therefore, there remains a need for a method of processing low dielectric constant films that minimizes damage to the films from subsequent processing steps, such as wet etch processes and the deposition of subsequent layers, such as BARC layers and barrier layers.

SUMMARY OF THE INVENTION

Embodiments of the invention provide a method of processing a substrate having a patterned porous dielectric layer deposited thereon, the porous dielectric layer having openings with sidewalls and bottom portions, the method comprising forming a conformal pore-sealing layer over the substrate by a plasma assisted ALD process, the pore-sealing layer contacting the porous dielectric layer on at least the sidewall portions of the openings; removing a portion of the conformal pore-sealing layer covering the bottom portions of the openings by performing a directional etch process; cleaning the substrate by performing a wet-clean process; and filling the openings with a conductive material. The conformal pore-sealing layer may be an oxide layer deposited using an organosilicon precursor, and the directional etch process may feature exposure to a plasma of fluorine compounds with electrical bias applied to the substrate.

Other embodiments provide a method of processing a substrate, comprising forming a patterned porous dielectric layer, having openings with sidewalls and bottom portions, on the substrate; performing a first cleaning process on the patterned porous dielectric layer; thermally treating the patterned porous dielectric layer; forming a conformal pore-sealing oxide layer over the substrate; removing the conformal pore-sealing oxide layer from the bottom portions of the openings using an etch process that does not etch the sidewalls; performing a second cleaning process on the substrate having the conformal pore-sealing oxide layer deposited thereon; and filling the openings with a conductive material.

Other embodiments provide a method of forming a feature on a semiconductor substrate, comprising forming a porous dielectric layer having a dielectric constant of 3.0 or less, and comprising silicon, oxygen, carbon, and hydrogen, on the substrate; forming a dense dielectric layer on the porous dielectric layer; patterning the dense dielectric layer and the porous dielectric layer to form openings having sidewalls and bottom portions, the space between the openings defining a field region of the substrate; forming a conformal pore-sealing layer on the substrate by performing one or more processing cycles, each cycle comprising depositing a precursor layer by exposing the surface of the substrate to an organic siloxane precursor and treating the precursor layer with a plasma containing oxygen; removing portions of the conformal pore-sealing layer deposited on the field region of the substrate and bottom portions of the openings using a selective process; performing a wet-clean process on the substrate; forming a conformal barrier layer on the substrate; forming a seed layer on the substrate; and filling the openings with conductive material by a plating process.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is a flow diagram showing a method according to one embodiment of the invention.

FIGS. 1B-1E are side views showing a substrate at various stages of the method of FIG. 1A.

FIG. 2A is a flow diagram showing a method according to another embodiment of the invention.

FIGS. 2B-2G are side views showing a substrate at various stages of the method of FIG. 2A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide methods of preventing damage to porous dielectric layers during fabrication of features in semiconductor substrates. In some processes, the substrate may be exposed to liquids, which may intrude into the pores of a porous dielectric material and damage its electrical properties. To avoid this result, protective layers may be deposited over surfaces of the porous dielectric material that would otherwise contact the liquid. The protective layers are generally dense materials capable of repelling the liquid components, and they generally have low dielectric constant so that the electrical properties of the device are not degraded by inclusion of the protective layer.

In one embodiment, a porous low dielectric constant film is formed on a semiconductor substrate. The porous low dielectric constant film may be a film comprising silicon, carbon, and optionally oxygen and/or nitrogen. The porous low dielectric constant film may be deposited from a gas mixture comprising an organosilicon compound, such as an organosilane or organosiloxane. The gas mixture may also include an oxidizing gas. In one embodiment, the gas mixture comprises an organosilicon compound and a porogen, such as a hydrocarbon, that is removed from the film after the film is deposited to create voids or pores in the film and lower the dielectric constant of the film. The porogen may be removed by a UV treatment, electron beam treatment, thermal treatment, or a combination thereof. Methods of forming porous low dielectric constant films are further described in commonly assigned U.S. Pat. No. 6,936,551 and in commonly assigned U.S. Pat. No. 7,060,330, which are herein incorporated by reference. It is noted that low dielectric constant films that have other compositions and/or are deposited from different gas mixtures can be used in embodiments of the invention.

In some embodiments, a dense dielectric film may be formed over the porous dielectric layer. The dense dielectric film may be any substance with a low dielectric constant, and may serve as a polish stop layer in some embodiments. As such, the dense dielectric film may be an oxide or nitride film, and may be formed by a CVD or ALD process that may also be plasma enhanced. A dense dielectric film comprising silicon, oxygen, nitrogen, carbon, hydrogen, or any combination of these, may be used as a protective layer. The dense dielectric film may be a capping layer in some embodiments. In other embodiments, the dense dielectric film may be doped with any desired dopant. In some embodiments, the dense dielectric layer may be subjected to post-deposition processing to change its surface composition or texture. For example, nitrogen, oxygen, carbon, or hydrogen may be added to a layer near the surface of the dense dielectric film through a surface chemistry process such as nitridation or oxidation, or through an implant process such as plasma ion implantation. For most embodiments of the invention, it is generally preferable that the dense layer be resistant to oxidizing processes. Some exemplary dense layers useful for this purpose are silicon oxide and silicon nitride layers. The dense layers used for this purpose are generally thin, such as less than about 50 Angstroms thick. An exemplary dense dielectric film suitable for this process is the BLOk™ dielectric produced by fabrication tools available from Applied Materials, Inc., of Santa Clara, Calif.

FIG. 1A is a flow diagram showing a method 100 according to one embodiment of the invention. In the method 100, a dielectric layer comprising a porous dielectric layer is patterned at 102 using any conventional photolithography process. In one such process, a photoresist is applied to the layer to be patterned, the photoresist is exposed to patterned UV light to create a pattern in the photoresist, and the pattern is chemically developed. The substrate is then exposed to an etchant selected to etch the dielectric material without affecting the photoresist. The photoresist serves as a pattern mask for etching the dielectric material. The photoresist is then removed by oxidation to leave the desired pattern in the underlying dielectric material. FIG. 1B is a side view of a substrate at this stage of the process. The substrate 150 has a dielectric layer, comprising a porous dielectric layer 152 and a dense dielectric layer 154, formed thereon, and has been patterned to produce openings 156. The openings 156 have sidewalls 164 which are at least partially porous.

A conformal pore-sealing layer is formed over the substrate at 104. In many embodiments, the conformal pore-sealing layer is a dense dielectric layer. In most embodiments, the conformal pore-sealing layer is thin, because a film deployed for purposes such as pore-sealing will generally be incorporated into the device structure, and a thin film will have minimal impact on electrical properties of the device. FIG. 1C is a side view showing the substrate of FIG. 1B at this stage of the method 100. The substrate 150, the porous dielectric layer 152 and the dense dielectric layer 154 are covered by the conformal pore-sealing film 158. The conformal pore-sealing film 158 contacts the substrate 150 at the bottom portions of the openings 156, the porous dielectric layer 152 on the sidewalls of the openings 156, and the dense dielectric layer 154 on the field region of the substrate.

The conformal pore-sealing layer of the present invention may be any dense dielectric material with low dielectric constant capable of being deposited conformally. In one embodiment, silicon oxide, optionally doped with carbon, nitrogen, fluorine, boron, or other dopant, may be deposited conformally using a plasma-assisted ALD process. The substrate may be exposed in a process chamber to a first gas mixture comprising an organosilicon precursor, which may be ionized or converted into a plasma in some embodiments. Carrier gases such as nitrogen, helium, argon, or combinations thereof may also be mixed with the organosilicon precursor. The organosilicon precursor is generally vaporized, in some embodiments, by passing a warm carrier gas through a vessel holding the precursor in liquid or solid form, or by flowing the liquid precursor through a vaporizer. Dopant precursors may also be provided to facilitate incorporation of dopants into the film. The organosilicon precursor will adhere to the substrate surface until all adhesion sites have been occupied. At that point, the reaction stops and no further deposition takes place. If dopant precursors are provided, they may occupy some adhesion sites. Any excess precursor is then removed from the chamber.

The adhered layer may then be exposed to a second gas mixture comprising an oxidizing agent. In many embodiments, an ionized gas, which may be a plasma, comprising oxygen is used as the oxidizing agent. In some embodiments, an oxygen plasma is used. In other embodiments, an ionized gas, which may be a plasma, of oxygen containing compounds such as ozone ($O_3$), nitrous oxide ($N_2O$), nitric oxide ($N_3O$), carbon monoxide (CO), carbon dioxide ($CO_2$), or combinations thereof, may generate the oxidizing environment. In still other embodiments, thermal oxidation may be used.

The precursor gases may be ionized by application of an electric or magnetic field. In some embodiments, a plasma may be generated by capacitative or inductive means, and may be powered by DC or preferably radio-frequency alternating current. Precursors useful for embodiments of the invention may be suitably activated by application of between about 500 Watts and about 5000 Watts of power, depending on the ionization potential of the various components of the gas mixtures, and the degree of activation desired. In some embodiments, an electrical bias may be applied to the substrate to enhance the rate of deposition. In embodiments featuring use of an electrical bias, the bias will preferably be weak, such as a DC bias applied at a power level less than about 500 Watts, in order to achieve conformal deposition.

The cycle of deposition and oxidation is repeated until a desired thickness is reached. Some embodiments of the present invention feature a conformal pore-sealing film comprising a single molecular layer and measuring 4 Angstroms or less in thickness. A conformal layer of silicon oxide, possibly doped with carbon or fluorine, may be useful up to thicknesses of about 15 Angstroms in some embodiments without degrading electrical properties. In alternate embodiments, the conformal layer may have thickness up to about 50 Angstroms.

Each exposure of the cycle may be a pulse of gas, alternating between a first gas mixture comprising the organosilicon precursor and a second gas mixture comprising the oxidizing agent. Each pulse may remain in the process chamber from about 1 second to about 10 seconds, and may then be purged from the chamber. In alternate embodiments, a purge gas or carrier gas may be provided to the chamber continuously, while the precursor gases are alternately pulsed into the flowing stream of purge or carrier gas. The purge or carrier gases used in embodiments of the invention are generally non-reactive gases under the conditions encountered during processing, such as noble gases or non-reactive elemental gases. Argon, helium, neon, and xenon are examples of noble gases that may be used. In some embodiments, nitrogen gas may also be used.

Octamethylcyclotetrasiloxane (OMCTS) is an example of a precursor that may be used to deposit the conformal pore-sealing layer described herein. In addition to OMCTS, precursors having the general formula $R_x$—Si—$(OR')_y$, such as dimethyldimethoxysilane $(CH_3)_2$—Si—$(O—CH_3)_2$, wherein each R=H, $CH_3$, $CH_2CH_3$, or another alkyl group, each R'=$CH_3$, $CH_2CH_3$, or another alkyl group, x is from 0 to 4, y is 0 to 4, and x+y=4, may also be used to deposit a thin conformal layer with a suitable process window. Other precursors that may be used include organodisiloxanes having the structure $(R_X$—Si—O—Si—$R_Y)_z$, such as 1,3-dimethyldisiloxane ($CH_3$—$SiH_2$—O—$SiH_2$—$CH_3$), 1,1,3,3-tetramethyldisiloxane (($CH_3)_2$—SiH—O—SiH—$(CH_3)_2$), hexamethyldisiloxane (($CH_3)_3$—Si—O—Si—$(CH_3)_3$), etc. Other precursors that may be used include cyclic organosiloxanes ($R_X$—Si—O)$_y$, wherein y is greater than 2, x is from 1 to 2, and $R_X$=$CH_3$, $CH_2CH_3$, or another alkyl group. Cyclic organosilicon compounds that may be used may include a ring structure having three or more silicon atoms and the ring structure may further comprise one or more oxygen atoms. Commercially available cyclic organosilicon compounds include rings having alternating silicon and oxygen atoms with one or two alkyl groups bonded to the silicon atoms. For example, the cyclic organosilicon compounds may include one or more of the following compounds:

hexamethylcyclotrisiloxane (—Si$(CH_3)_2$—O—)$_3$-cyclic,
1,3,5,7-tetramethylcyclotetrasiloxane (TMCTS) (—SiH$(CH_3)$—O—)$_4$-cyclic,
octamethylcyclotetrasiloxane (OMCTS) (—Si$(CH_3)_2$—O—)$_4$-cyclic, and
1,3,5,7,9-pentamethylcyclopentasiloxane (—SiH$(CH_3)$—O—)$_5$-cyclic.

Referring again to FIG. 1A, at 106 portions of the conformal pore-sealing layer covering the bottom portions 160 of the openings are removed. FIG. 1D illustrates the substrate of FIGS. 1A-1C at this stage of the method 100. The surface of substrate 150 is exposed at the bottom portions 160 of the openings 156, as is the field region 166 of the dielectric layer comprising the porous dielectric layer 152 and the dense dielectric layer 154. The conformal pore-sealing film 158 covering the sidewalls 164 of the openings 156 has not been disturbed, and remains to protect the porous dielectric layer 152 along the sidewalls 164.

The portions of the conformal pore-sealing layer 158 covering the bottom portions 160 of the openings 156 may be removed using a selective process adapted to remove only those portions of the layer. In some embodiments, the selective process may be a directional etch process, such as reactive ion etching. In some embodiments, an ionized gas, which may be a plasma, containing fluorine ions may be used to etch an oxide conformal pore-sealing layer, and an electrical bias may be applied to the substrate to encourage etching the field region 166 and bottom portions 160 of the openings 156. The electrical bias encourages the reactive ions to accelerate toward the surface of the substrate 150, penetrating deep into the openings 156 before veering toward the sidewalls 164. In this way, material on the sidewalls 164 is etched very little or not at all, while material covering the bottom portions 160 of the openings 156 and the field region 166 is removed.

An electrical bias applied at power levels of 100 Watts or greater may be useful for this purpose. The electrical bias may be generated by application of a DC voltage to the substrate support or gas distribution plate on which the substrate is disposed. In other embodiments, an alternating voltage, such as an RF voltage, modulated by a filter such as a high-pass or low-pass filter may be used.

Compounds useful for performing a directional etch on a conformal oxide layer include halides of carbon, sulfur, and nitrogen. Exemplary materials are $CF_4$, $SF_6$, $NF_3$, and $CHF_3$. Chlorine containing analogs will also etch these layers at somewhat slower rates.

In one exemplary embodiment, etchant $SF_6$ may be provided to a processing chamber to etch a substrate having an exposed silicon oxide layer. The etchant may be provided at a flow rate of between about 20 sccm and about 1000 sccm, such as between about 100 sccm and 500 sccm, for example about 300 sccm. A non-reactive carrier gas such as helium, argon, neon, or xenon may be provided. The substrate may be maintained at a temperature of between about 50° C. and about 500° C., such as between about 200° C. and about 400° C., for example about 300° C. The chamber may be maintained at a pressure between about 1 mTorr and about 10 Torr, such as between about 1 Torr and about 5 Torr, for example about 2 Torr.

RF power of between about 200 W to about 5000 W may be applied at a high single frequency of 13.56 MHz, or at a low single frequency of between about 100 kHz and about 600 kHz, such as about 400 kHz, or at a mixed frequency having a first frequency of about 400 kHz and a second frequency of about 13.56 MHz. The RF power may be capacitatively or inductively coupled. An electrical bias may be applied to the substrate by applying a voltage to the substrate support or the gas distribution plate with a power range between about 100 W and about 1000 W, such as about 500 W. As described above, the voltage may be applied using a DC or AC source, the AC source modulated with a low-pass or high-pass filter according to the particular embodiment. The RF power dissociates fluoride ions $F^-$ from $SF_6$ molecules, and the electrical bias accelerates the ions toward the substrate surface. Ions accelerate toward the field region and into the openings 156 (FIG. 1C). Ions that penetrate into the openings 156 generally travel to the bottom 160 and etch the conformal pore-sealing film 158 at the bottom 160 of the openings 156.

In an alternate embodiment, the bottom portion 160 of the openings 156 may be etched using non-reactive ions. A noble gas, such as argon, helium, neon, or xenon, may be ionized into a plasma and accelerated toward the surface of the substrate by a voltage bias applied to the substrate according to methods described above. The energetic ions thus created will then impact the field region of the substrate and the bottom portion 160 of the openings 156, eroding the conformal layer from the bottom portion 160 or the openings 156 by high-energy impact. In other embodiments, a sputtering process may be used to selectively remove material from the bottom portion 160 of the openings 156.

Referring again to FIG. 1A, a wet-clean process may be performed on the substrate at 108 to remove residual material from the field region and openings 156 of the substrate in preparation for filling with conductive material. The porous dielectric layer having been protected by application of the dense dielectric layer on top and the conformal pore-sealing dielectric layer on the sidewalls, the cleaning liquid does not penetrate the pores of the porous dielectric. The porous dielectric thus retains its beneficial electrical properties. Reagents such as aqueous HF, dilute HF, optionally buffered or mixed with other aqueous species, or a solvent such as IPA may be applied to the substrate without damaging the porous layer.

The openings may be filled with conductive material at 110 using any convenient process, such as electroplating or electroless deposition. FIG. 1E shows the substrate 150 with the openings 156 filled with conductive material 162. The conformal pore-sealing film 158 remains incorporated into the device in this embodiment, but does not substantially impact the electrical properties thereof due to its low dielectric constant.

Although a wet clean process is frequently used in fabrication sequences such as that described above, it should be noted that pore-sealing of porous dielectric layers renders them impervious to many liquids. Any liquid that does not penetrate or etch dense silica or silicon-containing layers will not reach the porous dielectric. Moreover, any fluid, gas, liquid, or plasma that does not etch through the dense layers will not reach the porous dielectric. For example, the embodiments of the pore-sealing process described herein may be used for fabrication sequences involving plasma clean processes that may otherwise damage a porous dielectric layer.

Other embodiments of the invention provide methods of processing substrates having porous dielectric layers deposited thereon. FIG. 2A is a flow diagram showing a method 200 according to one embodiment of the invention. At 202, a porous dielectric layer is formed on a substrate. The porous dielectric layer may be formed by depositing a layer containing silicon, carbon, and oxygen on the substrate using methods similar to those described above, and then post-treating the deposited layer to remove some of the carbon atoms, leaving voids among the remaining silicon and oxygen atoms. The space left by the removed carbon atoms results in pores within the film. In some embodiments, a film so formed may have porosity greater than 20%, such as greater than 30%, for example about 40%. FIG. 2B shows a substrate 250, with a porous dielectric layer 252 formed thereon as described above.

A dense dielectric layer is formed over the porous dielectric layer at 204. The dense dielectric layer protects the porous dielectric layer from damage during subsequent processing steps, while maintaining the electrical properties of the device. In some embodiments, the dense dielectric layer may be a capping layer, such as a silicon and nitrogen containing layer. In most embodiments, the dense dielectric layer is preferably thin, such as less than 50 Angstroms thick. In some embodiments, the dense dielectric layer may be a layer containing a combination of silicon, nitrogen, oxygen, carbon, and hydrogen. The dense dielectric layer may additionally be doped with boron, phosphorus, arsenic, germanium, argon, helium, fluorine, chlorine, or combinations thereof. The dense dielectric layer may be formed by CVD, ALE, or ALD, with or without plasma enhancement. FIG. 2C shows the substrate 250, with the porous dielectric layer 252 and the dense dielectric layer 254 deposited thereon.

The composite dielectric layer comprising the porous dielectric layer and the dense dielectric layer is patterned at 206, using a process similar to that described above in connection with FIGS. 1A-1E. A photoresist is applied over the dense dielectric layer. The photoresist is generally carbon-based and polymeric, and is usually applied in a spin-on procedure. Patterned radiation is generally used to create a pattern in the photoresist. Radiation of a wavelength selected to effect a transformation of the photoresist material is passed through a pattern mask or reticle, which blocks portions of the radiation. The pattern is then developed in the photoresist to produce openings for etching layers beneath. The substrate with patterned photoresist is then subjected to an etching process. The etching process is generally adapted to etch the dielectric under the photoresist. An anti-reflective coating may be applied prior to formation of the photoresist layer. After etching, the photoresist and anti-reflective coating, if used, is removed. FIG. 2D shows the substrate 250 with openings 256 formed by a patterning process such as the foregoing.

In many fabrication processes, a wet clean operation may be performed at 208 to remove any residual photoresist and anti-reflective materials prior to filling the openings 256 with conductive material. The wet clean operation may be generally similar to that described above, and may feature an aqueous HF solution, optionally buffered or mixed with other aqueous species.

It is generally observed that liquid components may penetrate the pores of the porous dielectric layer 252. Such components may degrade the electrical properties of the eventual structure if not removed. To remove any contaminants from the porous dielectric, the substrate may be subjected to a thermal treatment at 210. The thermal treatment may be a baking operation, or may be a rapid thermal process wherein the substrate is rapidly heated to a high temperature for a short time and then rapidly cooled. The thermal treatment may be carried out using heat lamps oriented toward the substrate, convective ambient heating, or conductive heating such as a heated substrate support. In alternate embodiments, the substrate may be subjected to other forms of energy to remove the contaminants, such as electromagnetic energy of wavelength bands from infrared to ultraviolet, which may be coherent or incoherent, monochromatic or polychrome, polarized or unpolarized, focused or diffuse, or any degree thereof.

A conformal layer is formed over the substrate at 212. The conformal layer is generally a dense silicon-containing layer of a type susceptible to conformal deposition. The conformal layers described above in connection with FIGS. 1A-1E are suitable for this purpose. An exemplary conformal layer is a silicon oxide layer deposited by an ALD process, substantially as described above. FIG. 2E shows the substrate 250 with the conformal layer 258 formed thereon. In most embodiments, the conformal layer will preferably be thin, and in many embodiments a single molecular monolayer will suffice to seal the porous dielectric. As such, the conformal layer may have a thickness between about 4 Angstroms and about 15 Angstroms. In some embodiments, the thickness of the conformal layer may be up to about 50 Angstroms.

Portions of the conformal layer 258 covering the field region and the bottoms of the openings 256 are removed at 214, using processes substantially similar to those described above in connection with FIGS. 1A-1E. A directional etch process is performed to selectively etch the desired portions of the conformal layer 258, exposing the dense dielectric layer 254 and the substrate 250.

A second cleaning process may be performed at 216. As described above, the second cleaning process may be a wet clean process in which the substrate is exposed to a mild etching fluid to remove trace surface contaminants, or a dry clean process. The openings 256 may then be filled with conductive material by plating or deposition, such as electroplating, electrodeposition, or electroless deposition processes.

In one example, a porous dielectric layer was formed on a substrate in a plasma-assisted ALD process, and a pattern transferred into the porous dielectric layer. The substrate having the patterned layer was disposed in a plasma deposition chamber, and two precursor gas mixes were alternately pulsed into the chamber. Argon was provided to the chamber in a constant stream of between about 5000 sccm and 8000 sccm. An inductively coupled plasma was formed by providing two re-entrant ionization tubes, each coupled to an inductive core energized by 1000 Watts of RF power. Chamber pressure was maintained at about 2 Torr, and temperature at about 350° C.

A pulse of OMCTS, comprising about equal parts OMCTS and argon gas by volume, was charged to the chamber at a rate of 1000 sccm for about 1 second. After allowing the chamber to purge for 2 seconds, a pulse of oxygen gas was provided to the chamber to complete a single deposition cycle.

The substrate was exposed to a selective etch process in a second chamber. An electrical bias of 200 V was applied to the substrate by application of 500 Watts of RF power, modulated by use of a high-pass filter, to the substrate support. A mixture of 1 part HF in 5 parts argon gas was provided to the chamber at a rate of 2000 sccm, and was ionized by application of 2000 Watts of RF power to a capacitatively coupled apparatus. The gas mixture flowed for 30 seconds while the chamber pressure was maintained at 2 Torr and the temperature at 200° C.

Following this sequence, the substrate was subjected to immersion in 2-propanol. No penetration into the porous dielectric was observed after 60 minutes of exposure. Thus, the thin conformal oxide film sealed the porous dielectric from liquid intrusion.

While the foregoing is directed to embodiments of the invention, other and further embodiments of the invention may be devised without departing from the basic scope thereof, and the scope thereof is determined by the claims that follow.

What is claimed is:

1. A method of processing a substrate, comprising:
   forming a porous dielectric layer on the substrate;
   forming a dense dielectric layer over the porous dielectric layer;
   patterning the porous dielectric layer and the dense dielectric layer to form, openings with sidewalls and bottom portions;
   performing a first cleaning process on the substrate;
   thermally treating the patterned dielectric layers;
   forming a conformal pore-sealing oxide layer over the substrate;
   removing the conformal pore-sealing oxide layer from the bottom portions of the openings using a selective process;
   performing a second cleaning process on the substrate having the conformal pore-sealing oxide layer deposited thereon; and
   filling the openings with a conductive material.

2. The method of claim 1, wherein forming the conformal pore-sealing oxide layer comprises depositing a conformal oxide layer from an organosilicon precursor in an ALD process.

3. The method of claim 2, wherein the organosilicon precursor comprises an organic siloxane compound, and the ALD process comprises sequentially exposing the substrate to the organic siloxane compound and an oxidizing gas.

4. The method of claim 3, wherein the oxidizing gas comprises oxygen ions.

5. The method of claim 1, wherein the selective process is an etch process comprising exposing the conformal pore-sealing oxide layer to an etchant comprising reactive ions and applying an electrical bias to the substrate.

6. The method of claim 5, wherein the etchant comprises a plasma of one or more fluorine compounds.

7. The method of claim 1, wherein the conformal pore-sealing oxide layer has a thickness less than about 2 Angstroms.

8. The method of claim 1, wherein thermally treating the patterned dielectric layers comprises exposing the substrate to an elevated temperature for a time selected to remove contaminants from the first cleaning process.

9. The method of claim 1, wherein the first and second cleaning processes are wet-clean processes.

10. The method of claim 1, wherein the first cleaning process is a wet-clean process and the second cleaning process is a dry-clean process.

11. The method of claim 10, wherein the wet-clean process comprises exposing the substrate to an aqueous HF solution.

12. A method of processing a substrate, comprising:
    forming a porous dielectric layer on the substrate;
    forming a dense dielectric layer on the porous dielectric layer;
    patterning the dense dielectric layer and the porous dielectric layer to form, openings with sidewalls and bottom portions;
    performing a first cleaning process on the patterned dielectric layers;
    thermally treating the patterned dielectric layers;
    forming a conformal pore-sealing oxide layer over the substrate by an ALD process;
    removing the conformal pore-sealing oxide layer from the bottom portions of the openings using a selective process;
    performing a second cleaning process on the substrate having the conformal pore-sealing oxide layer deposited thereon; and
    filling the openings with a conductive material.

13. The method of claim 12, wherein the ALD process comprises sequentially exposing the substrate to an organic siloxane compound and an oxidizing gas, and the selective process comprises exposing the substrate to reactive ions in the presence of an electric field.

14. The method of claim 13, wherein the first and second cleaning processes are wet processes.

15. The method of claim 13, wherein the first cleaning process is a wet process and the second cleaning process is a dry process.

16. The method of claim 15, wherein the wet process comprises exposing the substrate to an aqueous HF solution.

* * * * *